(12) United States Patent
Chi et al.

(10) Patent No.: US 11,109,499 B2
(45) Date of Patent: Aug. 31, 2021

(54) INTEGRATION DEVICE FOR INTEGRATING FUNCTION MODULES

(71) Applicant: JESS-LINK PRODUCTS CO., LTD., New Taipei (TW)

(72) Inventors: Chung-Ping Chi, New Taipei (TW); Kun-Chan Wu, New Taipei (TW); MengYu Tsai, New Taipei (TW); Kun-Cheng Lin, New Taipei (TW); Sung-Ho Chiang, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 202 days.

(21) Appl. No.: 16/122,883

(22) Filed: Sep. 6, 2018

(65) Prior Publication Data
US 2019/0335599 A1    Oct. 31, 2019

(30) Foreign Application Priority Data
Apr. 30, 2018 (TW) .................. 107114656

(51) Int. Cl.
*G06F 15/16* (2006.01)
*H05K 5/02* (2006.01)
(Continued)

(52) U.S. Cl.
CPC .............. *H05K 5/0256* (2013.01); *H01F 7/02* (2013.01); *H02J 7/0068* (2013.01); *H04L 67/12* (2013.01); *H04L 12/2803* (2013.01)

(58) Field of Classification Search
CPC ... H04L 67/12; H04L 12/2803; H05K 5/0256; H01F 7/02; H02J 7/0068
See application file for complete search history.

(56) References Cited

U.S. PATENT DOCUMENTS 9,161,464 B2 * 10/2015 Liao .................. H05K 5/0065
9,748,689 B1    8/2017 Kim et al.
(Continued)

FOREIGN PATENT DOCUMENTS

CN        1043706 C      6/1999
CN      103959707 A      7/2014
(Continued)

OTHER PUBLICATIONS

Office Action dated Mar. 19, 2019 of the corresponding Taiwan patent application.
(Continued)

*Primary Examiner* — Hua Fan
(74) *Attorney, Agent, or Firm* — Chun-Ming Shih; HDLS IPR Services

(57) ABSTRACT

An integration device (1) includes a control module (10), a body (2) and a plurality of function modules (3). The control module (10) is arranged in the body (2) and includes a wireless transmission unit (11) and an MCU (12). The body (2) is a 3D object constituted by several faces, each face is formed thereon an assembling slot (21) that has a size and shape corresponding to that of the function modules (3), and each assembling slot (21) is respectively arranged with one connecting port (22) electrically connected with the control module (10). Each of the function modules (3) is respectively arranged onto one of the assembling slots (21) for communicating with the control module (10) through the connecting port (22). The integration device (1) is for the function modules (3) to be assembled together and connect with IoT apparatuses through the control of the control module (10).

12 Claims, 11 Drawing Sheets

(51) Int. Cl.
*H01F 7/02* (2006.01)
*H02J 7/00* (2006.01)
*H04L 29/08* (2006.01)
*H04L 12/28* (2006.01)

(56) References Cited

U.S. PATENT DOCUMENTS

| | | | | |
|---|---|---|---|---|
| 2002/0181249 A1* | 12/2002 | Coffey | ............ | H02J 1/00 363/1 |
| 2011/0106996 A1* | 5/2011 | Rosso | ............ | G06F 13/409 710/300 |

FOREIGN PATENT DOCUMENTS

| | | | |
|---|---|---|---|
| CN | 104201505 A | 12/2014 | |
| CN | 206022735 U | 3/2017 | |
| TW | M567885 M | 10/2018 | |

OTHER PUBLICATIONS

Search Report dated Nov. 12, 2018 of the corresponding European patent application.

* cited by examiner

INTEGRATION DEVICE FOR INTEGRATING FUNCTION MODULES

BACKGROUND OF THE INVENTION

1. Technical Field

The technical field relates to an integration device, and specifically relates to an integration device for integrating function modules.

2. Description of Related Art

Due to the development of internet of thing (IoT), a bunch of intellectual devices capable of networking are proposed, such as intellectual speakers, temperature sensors, air quality sensors, etc. By using these kinds of intellectual devices which are supported by the IoT, users may easily monitor and control every electronic appliances in their own house.

However, the well-known IoT devices in the current market are individually existed. If users want to monitor both temperature and air quality in their house at a time, a temperature sensor(s) and an air quality sensor(s) are necessary to be purchased and used respectively. In the end, it is lack of flexibility in using these IoT devices and reduces the willingness of the users of using the same.

Besides, these IoT devices mentioned above are all manufactured individually, there're a lot of redundant electronic components (for example, MCUs, network units) embedded in these devices, it causes the waste of the electronic components and fixes the cost and the sale price of the IoT devices in a high peak.

SUMMARY OF THE INVENTION

The object of the invention is to provide an integration device for integrating function modules, which may integrate multiple function modules capable of different functions into one single device, and control these function modules to communicate with the IoT devices surrounding through a single control module upon the integration device.

To achieve the above object, the integration device of the present invention includes a control module, a body, and a plurality of function modules. The control module is arranged in the body and includes a wireless transmission unit and an MCU. The body is a 3D object consisted of multiple faces, each of the faces is respectively formed thereon an assembling slot which has a size and a shape corresponding to the size and the shape of each function module, and each face is respectively arranged with one connection port electrically connected with the control module. The plurality of function modules is respectively assembled on one of the assembling slots for communicating with the control module through each of the connection ports.

In comparison with related art, the integration device of the present invention may easily arrange multiple function modules capable of different functions onto one single body and enable these function modules to connect to the Internet for communicating with the IoT devices in the environment through the control of a control module inside the body, thus the setting procedure for connecting to the IoT is greatly simplified and the threshold of using same is reduced.

DETAILED DESCRIPTION OF THE INVENTION

In cooperation with the attached drawings, the technical contents and detailed description of the present invention are described thereinafter according to multiple embodiments, being not used to limit its executing scope. Any equivalent variation and modification made according to appended claims is all covered by the claims claimed by the present invention.

Figure 1A:
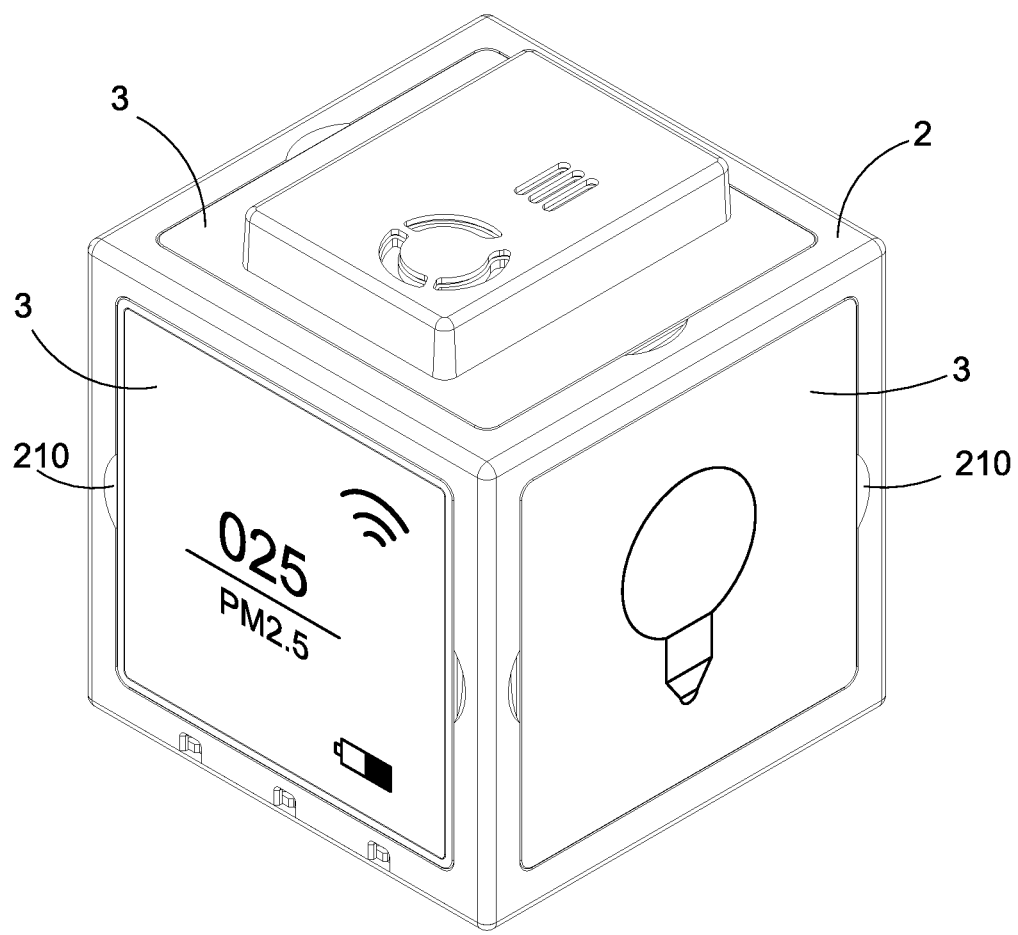
FIG. 1A is a schematic view of an integration device according to a first embodiment of the present invention.
Figure 1B:
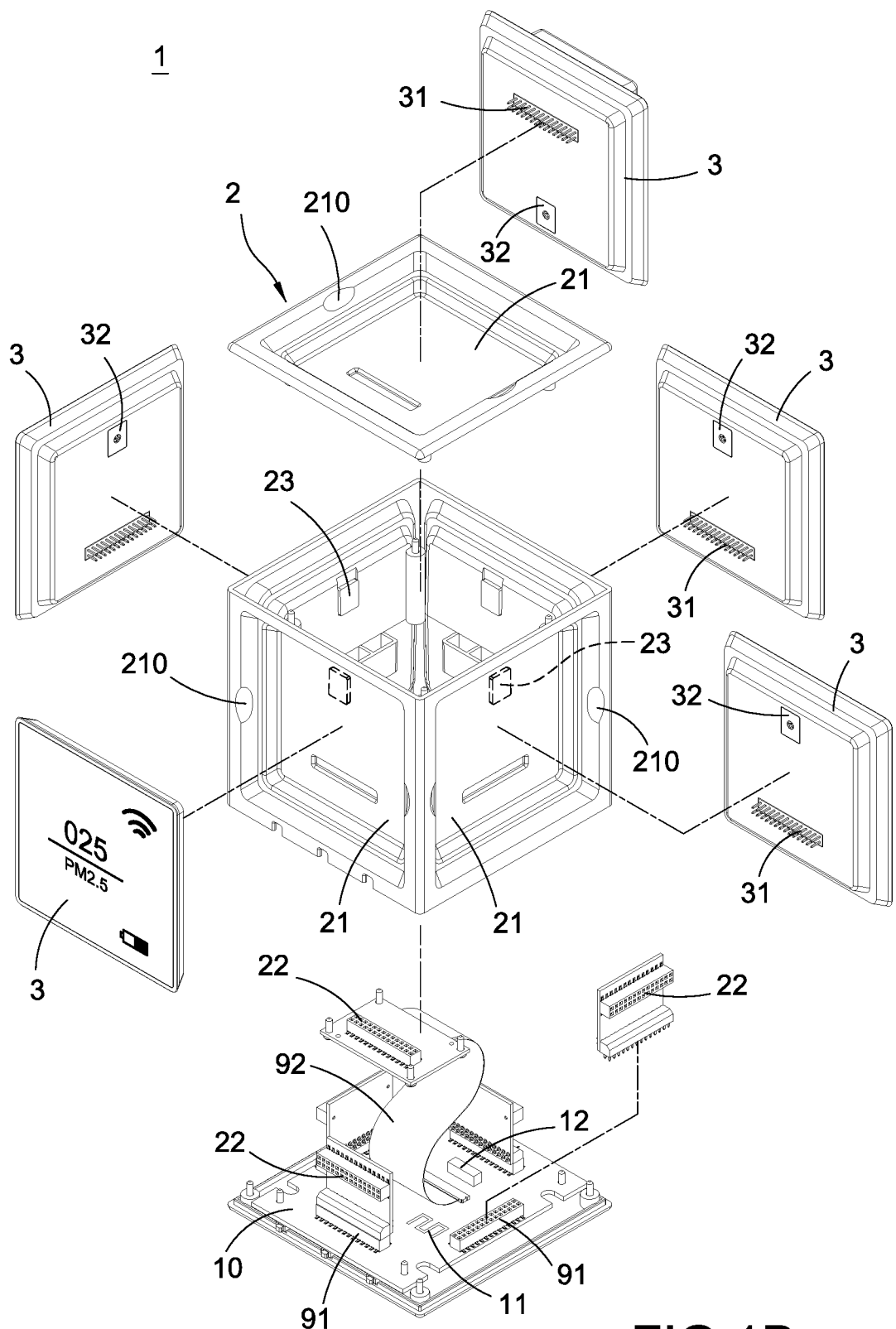
FIG. 1B is an exploded view of the integration device according to the first embodiment of the present invention.

Refers to FIG. 1A and FIG. 1B, in which FIG. 1A is a schematic view of an integration device according to a first embodiment of the present invention and FIG. 1B is an exploded view of the integration device according to the first embodiment of the present invention. The present invention discloses an integration device for integrating function modules (referred to as the integration device 1 hereinafter). The integration device 1 is used for integrating multiple function modules 3 that are capable of different functions and providing each of the function modules 3 the ability to connect to the Internet. As such, each of the function modules may connect and communicate with one or more IoT devices (such as a mobile device 4 and a home appliance 6 shown in FIG. 4) located in the environment after being activated.

As shown in FIG. 1 and FIG. 1B, the integration device 1 mainly includes a body 2, a control module 10, and multiple function modules 3. The control module 10 is basically arranged in the body 2. The plurality of function modules 3 is respectively assembled on external surfaces of the body 2 through corresponding structures.

Each of the function modules 3 is respectively used to perform different function. In an embodiment of FIG. 1A, the multiple function modules 3 may include an air quality sensor module for detecting the amount of PM2.5 in the environment, a display module for displaying messages like the PM2.5 amount, the network status, the battery life, etc., and a light switching module for controlling the ON/OFF status of the lights in the environment.

What is shown in FIG. 1A is just a part of examples of the present invention. In other embodiments, the multiple function modules may be optionally selected and purchased by the users and being assembled onto the external surfaces of the body 2 according to their own demand. The multiple function modules 3 may include, for example, a fan module, an air-condition controlling module, a contact sensing module, a temperature sensing module, a humidity sensing module, a vibration sensing module, a person sensing module, a smoke sensing module, a doorbell controlling module, an infrared module, a camera module, a wireless charging module, a speaker module, etc., but not limited thereto.

As shown in FIG. 1B, the body 2 is basically a 3D object constituted of multiple faces. The inside of the body 2 may be a solid structure or a hollow structure. Each face of the body 2 is formed inwardly an assembling slot 21. In the embodiment, the size and the shape of the multiple function modules 3 are corresponding to the size and the shape of the multiple assembling slots 21, turns out each of the function modules 3 can be arbitrarily assembled onto any one of the assembling slots 21.

In one embodiment, the control module 10 may be fixed and assembled on one face of the body 2 (in FIG. 1B, the control module 10 is assembled on the bottom face of the body 2) and electrically connected with the function modules 3 assembled thereon through first connection ports 22. In this embodiment, the body 2 and the control module 10 will be in sale as a package, which can prevent the users from being incapable of achieving the main goal of the present invention because they didn't purchase the control module 10 in company with the body 2.

In the embodiment of FIG. 1B, the body 2 is exemplified as a square object consisted of six faces having the exact same size and same shape. If the control module 10 is fixed and assembled on one face of the body 2, it will occupy one of the assembling slots 21 upon the body 2, and the body 2 will be only capable of assembling additional five function modules 3 (in the embodiment of FIG. 1B, these five function modules 3 are respectively assembled on a front face, a rear face, a left face, a right face, and top face of the body 2).

Figure 9:
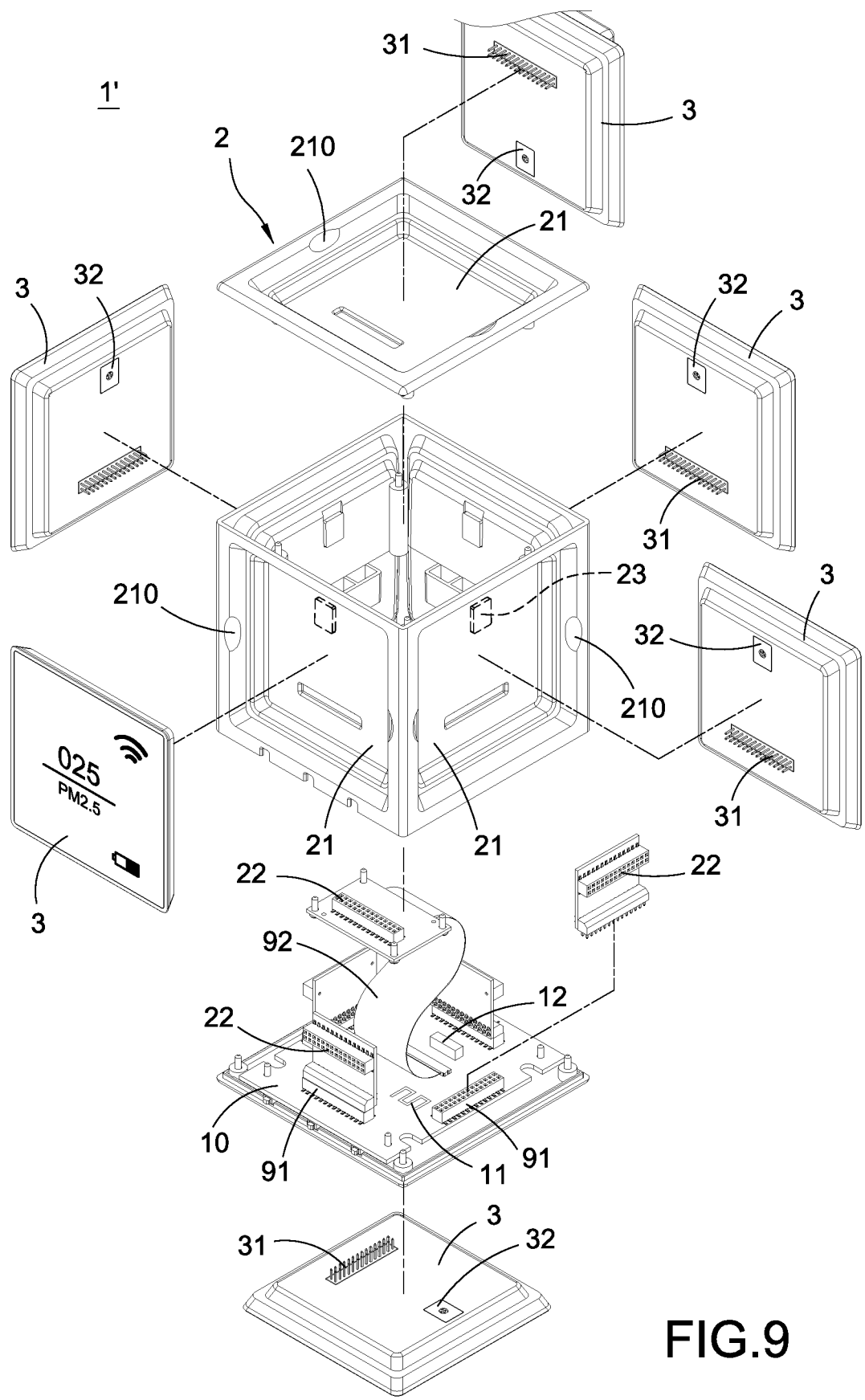
FIG. 9 is an exploded view of an integration device according to a sixth embodiment of the present invention.

Please refer to FIG. 9 along with FIG. 1A and FIG. 1B, wherein FIG. 9 is an exploded view of an integration device according to a sixth embodiment of the present invention and discloses another integration device 1'. The difference between the integration device 1 in FIG. 1B and the integration device 1' in FIG. 9 is that the integration device 1' in FIG. 9 arranges the control module 10 inside the body 2 (i.e., the body 2 in this embodiment has a hollow structure), so the arrangement of the control module 10 won't occupy any face of the body 2. Therefore, the body 2 of the integration device 1' is capable of assembling additional six function modules 3 at most (in the embodiment shown in FIG. 9, these six function modules 3 are respectively assembled on a front face, a rear face, a left face, a right face, a top face, and a bottom face of the body 2), and these six function modules 3 are electrically connected to the control module 10 inside the body 2 through six first connection ports 22 respectively.

Referring back to FIG. 1B, the control module 10 in the first embodiment further includes a wireless transmission unit 11 and a micro control unit (MCU) 12, wherein the MCU 12 is electrically connected with the wireless transmission unit 11. In the embodiment, the MCU 12 is used to integrate and control the multiple function modules 3 assembled on the body 2, the wireless transmission unit 11 is used to communicate with one or more IoT devices in the environment and transmit data and commands with the same. As such, each of the function modules 3 is unnecessary to be embedded with an individual MCU and an individual wireless transmission unit, therefore the cost in manufacturing these function modules 3 is greatly dropped and the volume of the same is effectively reduced as well.

The control module 10 is arranged with multiple first connection ports 22. In particular, one end of each of the first connection ports 22 is electrically connected on a circuit board of the control module 10 and electrically connected to the MCU 12 through the circuit board, another end of each of the first connection ports 22 is extended toward a direction against the circuit board and respectively exposed in one of the assembling slots 21 of the body 2. When a function module 3 is assembled onto one of the assembling slots 21 and electrically connected to the first connection port 22 exposed in the assembling slot 21, it can then electrically connect with the MCU 12 and the wireless transmission unit 11 of the control module 10 through the first connection port 22 and the circuit board.

In one embodiment, the control module 10 is arranged with multiple vertical transforming ports 91 on the circuit board, each transforming port 91 is respectively and electrically connected with the MCU 12 through the circuit board. In this embodiment, one end of each first connection port 22 is electrically connected to the transforming port 91 on the circuit board, and another end of each first connection port 22 is extended toward the direction against the circuit board and exposed in the assembling slot 21. The control module 10 in this embodiment is arranging the multiple transforming ports 91 to change the port direction of the multiple first connection ports 22, so the arrangement of the integration device 1 is made easier. In the embodiment of FIG. 1B, the port direction of each transforming port 91 is different from that of each first connection port 22 surrounding.

Besides, if one face of the body 2 is too far from the position of the control module 10 (for example, the top face of the body 2 in FIG. 1B is far from the bottom face where the control module 10 is arranged), the circuit board of the control module 10 may further arrange with a cable 92 that is electrically connected with the MCU 12, and the circuit board may connect with one of the first connection ports 22 through the cable 92. In this case, the first connector port 22 may be extended from the circuit board to the top face of the body 2 through the cable 92 for being arranged on the top face of the body 2 and exposed in the assembling slot 21 of the top face. However, the above description is just one of the exemplary embodiments of present invention, not limited thereto.

Each of the function modules 3 is respectively arranged with a second connection port 31 on a position that is corresponding to that of the first connection ports 22 in the assembling slots 21. When each function module 3 is assembled onto one of the assembling slots 21, it may establish a connection with the MCU 12 through the first connection port 22 and the second connection port 31, and can communicate with the IoT devices surrounding through the wireless transmission unit 11.

In one embodiment, the first connection ports 22 and the second connection ports 31 can be touch connectors, and these two ports 22, 31 are interconnected therewith when they touch each other. In another embodiment, the first connection ports 22 and the second connection ports 31 can be male connectors (plugs) and corresponding female connectors (receptacles), and these two ports 22, 31 are interconnected therewith when the male connector is inserted into the female connector. In a further embodiment, the first connection ports 22 and the second connection ports 31 can be pogo pins for increasing their connecting efficiency.

Figure 2:
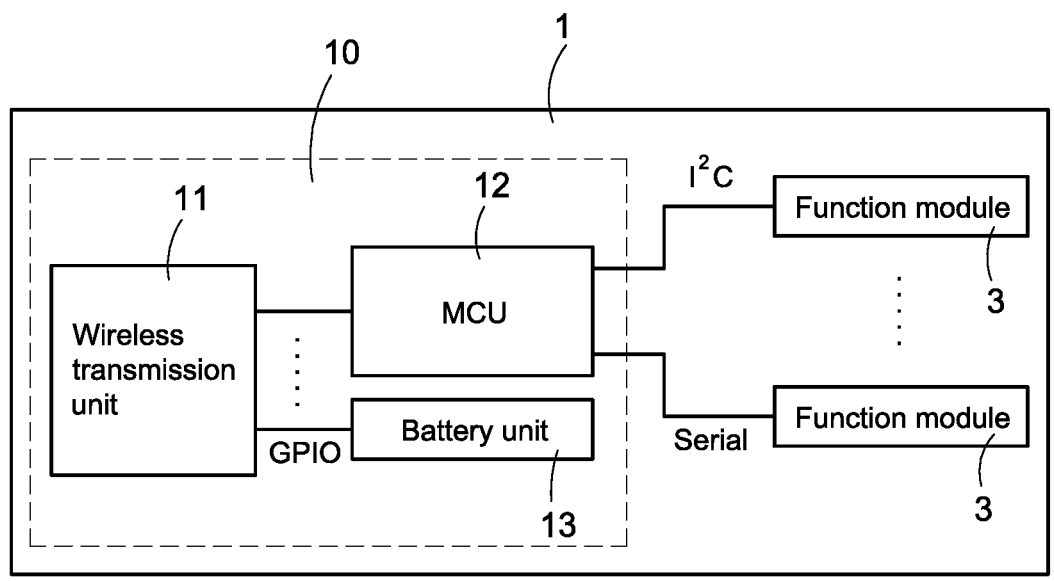
FIG. 2 is a block diagram of the integration device according to the first embodiment of the present invention.

FIG. 2 is a block diagram of the integration device according to the first embodiment of the present invention. One of the technical solutions of the present invention is to integrate multiple function modules 3 capable of different functions into a single body 2 and make these function modules 3 being able to connect to the Internet (or IoT) through a single wireless transmission unit 11. As a result, the MCU 12 of the control module 10 can not only integrate all information of each of the function modules 3, but also handle the problem that the connecting circuitries of the wireless transmission unit 11 are not enough for the great amount of function modules 3.

As shown in FIG. 2, the wireless transmission unit 11 is electrically connected with the MCU 12 through general purpose input/output (GPIO) interface, and the MCU 12 is basically connected with each function module 3 upon each assembling slot 21 through inter-integrated circuit (I²C) interface or different types of serial port. In other words, the first connection ports 22 and the second connection ports 31 in this embodiment are ports that can support the aforementioned I²C interface or serial ports (such as RS-232, RS-485, etc.), but not limited thereto. If the control module 10 is having the aforementioned transforming port 91 and/or cable 92, the transforming port 91 and cable 92 themselves also need to be supportable to the I²C interface and serial ports.

In the present invention, the wireless transmission unit 11 may be, for example, Bluetooth low energy (BLE) unit or Wi-Fi unit, not limited thereto. In one embodiment, each of the function modules 3 assembled on the integration device 1 may respectively connect to the electronic devices surrounding the integration device 1 through the BLE unit. In another embodiment, each of the function modules 3 assembled on the integration device 1 may connect to the electronic devices under the same domain or connect to a cloud server through the Wi-Fi unit.

In the embodiment shown in FIG. 2, the control module 10 further includes a battery unit 13 electrically connected with the MCU 12, which provides power to each of the function modules 3 assembled on the body 2. In other words, after being assembled onto one of the assembling slots 21, a function module 3 may obtain power from the battery unit 13 through the second connection port 31 and the first connection port 22 and the function module 3 may proceed to operate. In this case, it is unnecessary for the function modules 3 to arrange with an individual battery, so the cost in manufacturing the function modules 3 is saved and the volume of the same is reduced.

Figure 3A:
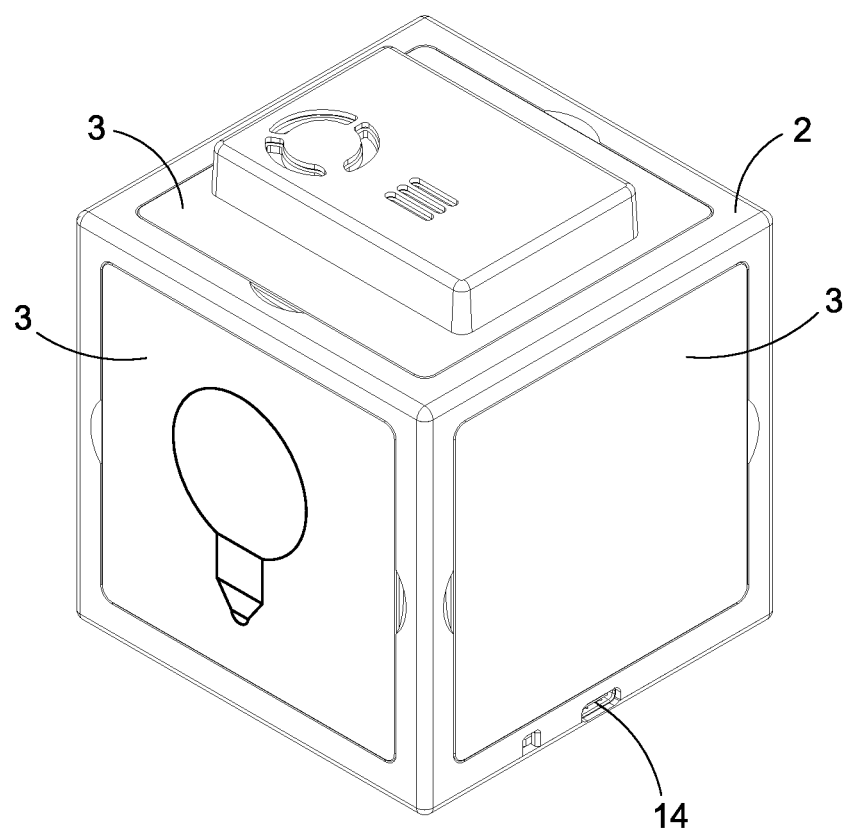
FIG. 3A is a schematic view of an integration device according to a second embodiment of the present invention.
Figure 3B:
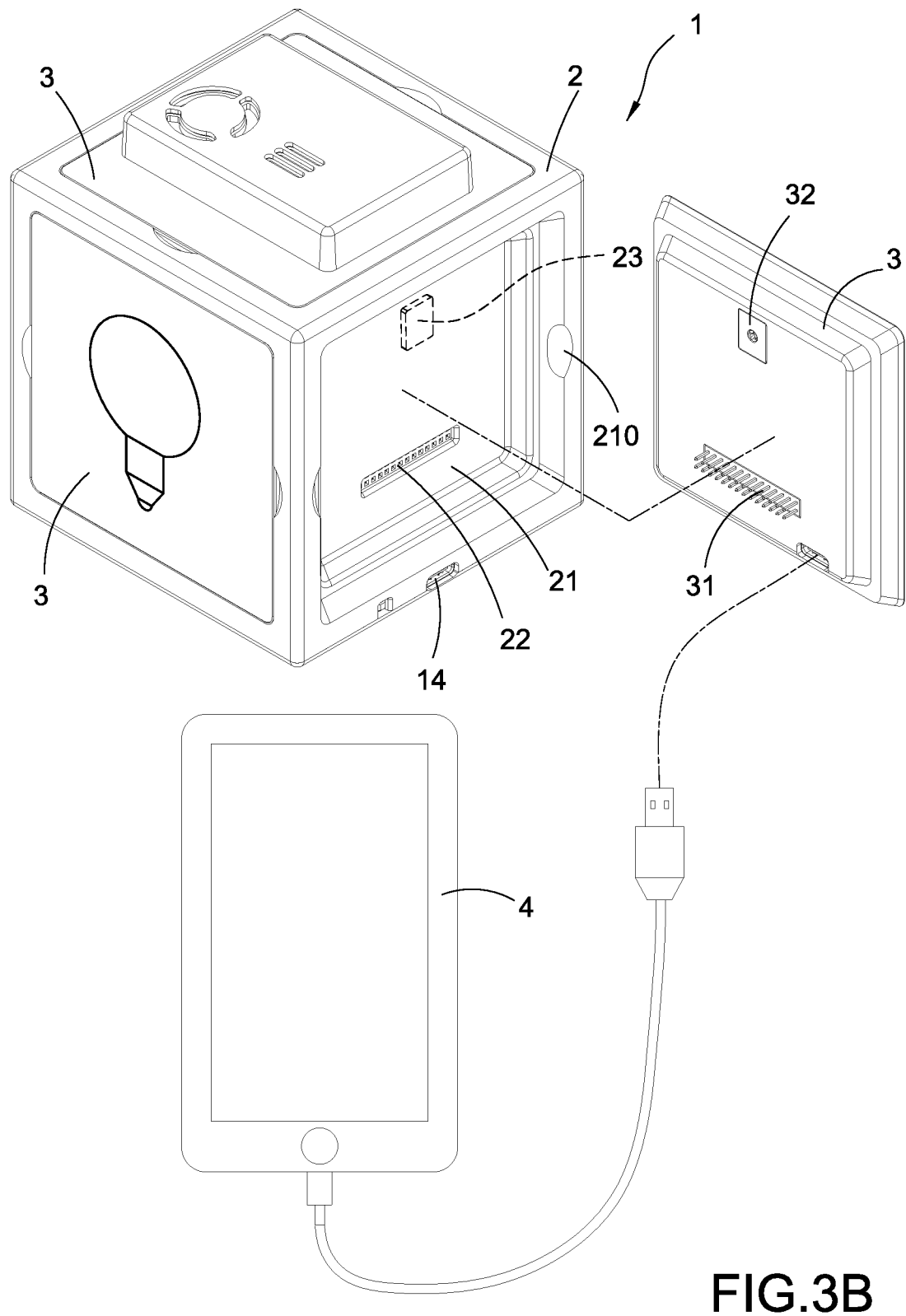
FIG. 3B is an exploded view of the integration device according to the second embodiment of the present invention.

FIG. 3A is a schematic view of an integration device according to a second embodiment of the present invention. FIG. 3B is an exploded view of the integration device according to the second embodiment of the present invention. In the embodiment, a power supplying port 14 electrically connected with the MCU 12 is arranged on the body 2. The integration device 1 may connect external power source (such as supply mains) through the power supplying port 14. If the control module 10 does not include the aforementioned battery unit 13, it may receive external power through the power supplying port 14 and provides the power for the function modules 3 that are assembled on the body 2.

If the control module 10 does include the aforementioned battery unit 13, the battery unit 13 therein may receive power from the power supplying port 14 to proceed charging. In this embodiment, the integration device 1 may charges the battery unit 13 by the power supplying port 14 when it is capable of stably receiving power through the power supplying port 14, and the integration device 1 may also provide the power to the multiple function modules 3 assembled on the body 2 through the power supplying port 14. Furthermore, the integration device 1 may provide power to the multiple function modules 3 assembled on the body 2 through the battery unit 13 whenever the power supplying port 14 stops receiving the power (for example, the connection between the power supplying port 14 and the power source is cut off). In particular, the battery unit 13 provides the power stored therein to each of the function modules 3 through the MCU 12 after the power supplying port 14 stops receiving the power from the external power source.

As shown in FIG. 3B, the battery unit 13 may be designed as one of the multiple function modules 3 and assembled on any one of the assembling slots 21 of the body 2. In particular, the battery unit 13 in this embodiment can be assembled on one of the assembling slots 21 for providing the power to the control module 10 and the reset of function modules 3 assembled on the body 2 through the first connection ports 22 and the second connection ports 31.

It should be mentioned that if the battery unit 13 is designed and manufactured as one of the function modules 3, it can further be arranged with a connector thereon. In this case, after being removed from the assembling slot 21, the battery unit 13 may connect to an external mobile device 4 by way of the connector and a transmission line, so as to provide power to the connected mobile device 4. In other words, the battery unit 13 being removed from the integration device 1 can be regarded and used as a portable power bank.

It should be mentioned that when being assembled on any one of the assembling slots 21, the battery unit 13 can directly provide the power to the integration device 1 through the second connection port 31 and the first connection port 22. After being removed from the assembling slot 21, the battery unit 13 may be connected to the power supplying port 14 through the above connector and transmission line, so as to provide the power to the integration device 1 by way of the power supplying port 14.

In this embodiment, the mobile device 4 may become one of the IoT devices capable of communicating with the integration device 1 after connecting to the Internet (such as a Bluetooth network or a Wi-Fi network). By communicating with the wireless transmission unit 11 on the control module 10, the mobile device 4 may transmit commands to the multiple function modules 3 assembled on the body 2 (for example, to control the ON/OFF status of the lights, to turn on/turn off the air-condition, to activate the camera, etc., by transmitting commands to the function modules 3), and receive related information from each of the function modules 3 (for example, the environment temperature, the environment humidity, the amount of people, the PM2.5 amount, the network status, the battery life, etc.) for displaying on the screen of the mobile device 4. In the end, the users are able to perform flexible operations via controlling the mobile device 4.

Figure 4:
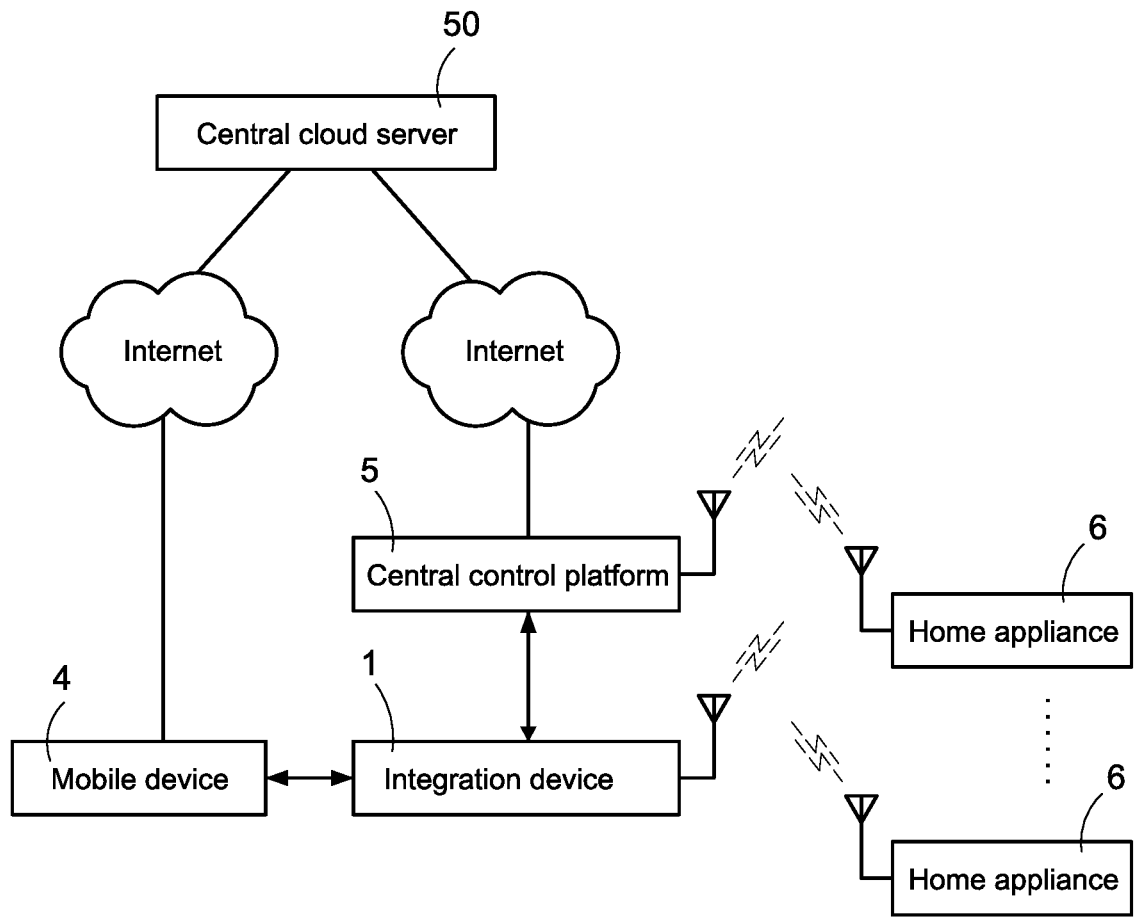
FIG. 4 is a schematic view of using the integration device of the present invention according to one example.

FIG. 4 is a schematic view of using the integration device of the present invention according to one example. The integration device 1 may be set inside the user's house, and the integration device 1 is used in the house to monitor home appliances 6 that are supporting the IoT in company with a central control platform 5. In this embodiment, the central control platform 5 may be, for example, an Apple TV or an iPad from Apple. Inc., but not limited thereto.

If the mobile device 4 is taken to the outdoor, the user may operate the mobile device 4 to connect to a central cloud server 50 (such as iCloud from Apple. Inc.) through the Internet and to send commands to the central cloud server 50 (for example, the mobile device 4 may send a control command for controlling a specific home appliance 6, or an inquiring command for inquiring information of the specific home appliance 6).

The aforementioned central control platform 5 in the house may perform a data synchronizing procedure with the central cloud server 50, therefore the central control platform 5 is able to obtain the above commands sent by the mobile device 4 from the central cloud server 50. After obtaining the commands, the central control platform 5 may control the specific home appliance 6 in the house according to the content of the commands, such as turning on the lights, adjusting the air volume of the air-condition, obtaining the PM2.5 amount, etc. Next, the central control platform 5 may synchronize the control results and the information obtained from the specific home appliance 6 to the central cloud server 50, so the mobile device 4 is able to obtain the control results and the information from the central cloud server 50, and is able to display these data through an application program (not shown).

It should be mentioned that for being synchronized in displaying information, the central control platform 5 may deliver the control results and the obtained information to the integration device 1 after controlling, so the integration device 1 itself may display the information same as the central control platform 5. For example, if one of the multiple function modules 3 assembled on the body 2 is the display module, the integration device 1 is capable of displaying the aforementioned control results and obtained information on the display module.

If the user is located inside the house, he or she may operate the mobile device 4 to connect to the integration device 1 through Bluetooth or Wi-Fi, so as to control the home appliances 6 or inquiry the information from the home appliances 6 through controlling the integration device 1. Similarly, for being synchronized in displaying information, the integration device 1 may deliver the control results and the obtained information to the central control platform 5 in the house, and the central control platform 5 may further synchronize the control results and the obtained information to the central cloud server 50 at cloud-end.

It should be mentioned that the user may install an application program (not shown) corresponding to the integration device 1 on the mobile device 4, and the mobile device 4 is able to quickly connect to the integration device 1 and control each of the function modules 3 on the integration device 1 through executing the application program. Otherwise, the user may also touch the integration device 1 directly for controlling each of the function modules 3 thereon via a more intuitive way.

Figure 5:
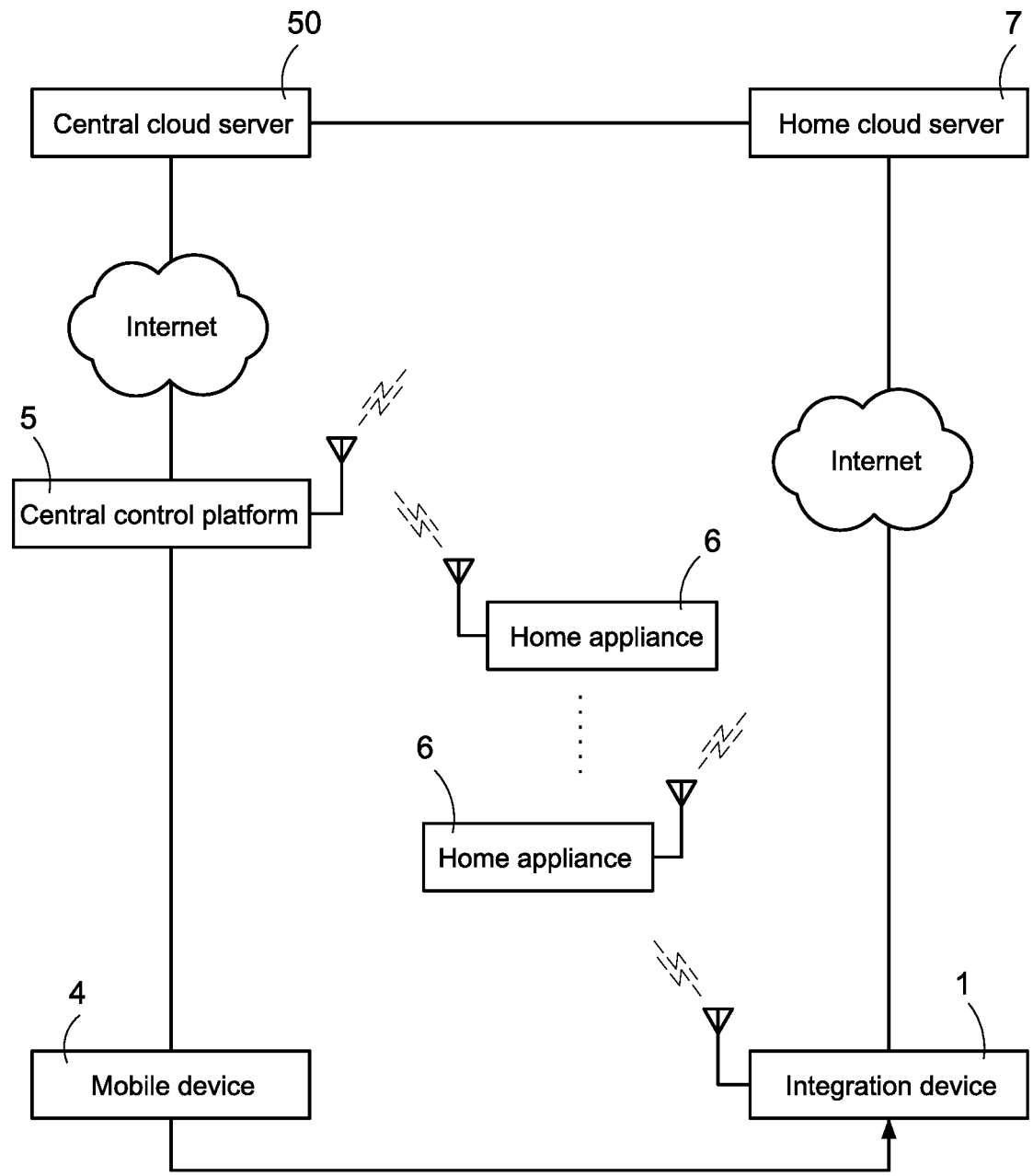
FIG. 5 is a schematic view of using the integration device of the present invention according to another example.

FIG. 5 is a schematic view of using the integration device of the present invention according to another example. In this embodiment, the central control platform 5 may be other kinds of control platform, such as Google Home from Google. Inc. or Alexa from Amazon.com, but not limited thereto.

In this embodiment, the user may operate the mobile device 4 to connect to and control the central control platform 5. After receiving commands sent from the mobile device 4, the central control platform 5 may control the corresponding home appliances 6 according to the content of the commands. Besides, the central control platform 5 may synchronize the control results and the obtained information to the central cloud server 50. In this embodiment, the central cloud server 50 establishes a connection with a home cloud server 7 that is corresponding to the integration device 1, and the central cloud server 50 may further synchronize the control results and the obtained information to the home cloud server 7. As a result, the integration device 1 may obtain the above control results and information from the home cloud server 7 (for example, the integration device 1 may perform the data synchronizing procedure with the home cloud server 7), so as to keep synchronized in displaying information.

Similarly, the user in this embodiment may operate the mobile device 4 to connect to and control the integration device 1 through the application program installed in the mobile device 4, and the user may also touch the integration device 1 directly to operate the same, it is not limited. The integration device 1 may control the home appliances 6 correspondingly or to obtain demanding information from the home appliances 6 according to the operation of the user.

Besides, for being synchronized in displaying information, the integration device 1 may deliver the above control results and obtained information to the home cloud server 7 after controlling, so the home cloud server 7 may further synchronize these data to the central cloud server 50 and the central control platform 5.

In this embodiment, the home cloud server 7 and the application program of the mobile device 4 may be designed and provided by the manufacturer of the integration device 1, therefore, the integration device 1 will be easily used by the user and won't face an incompatible issue with the mobile device 4.

In aforementioned embodiments, the body 2 is exemplified as a square object. However, one of the technical features of the present invention is making the multiple function modules 3 with different functions to have same size and same shape, so these function modules 3 can be arbitrarily assembled onto any face of the body 2 due to user's demand, but the shape of the body 2 is not limited as such. Detailed description is in the following.

Figure 6:
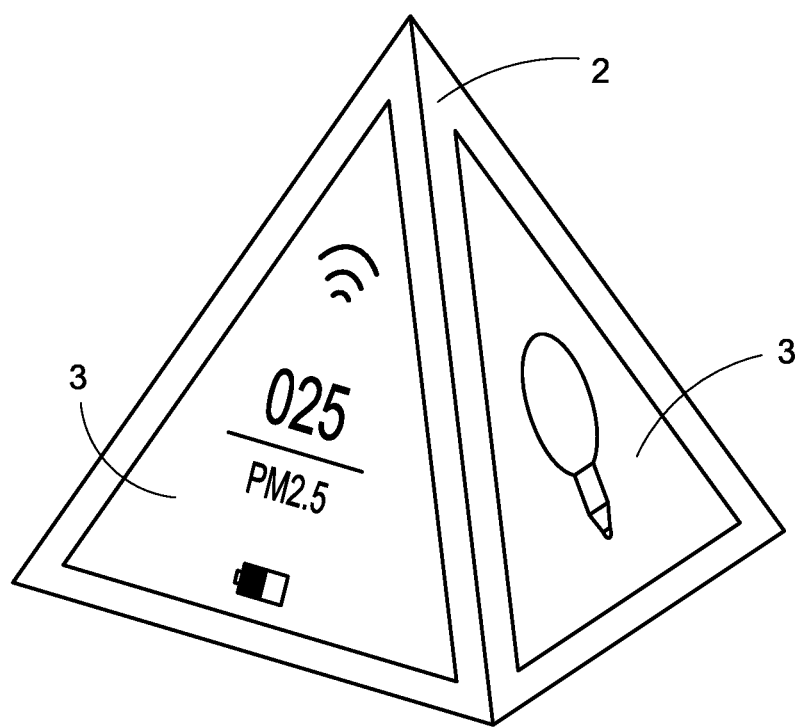
FIG. 6 is a schematic view of an integration device according to a third embodiment of the present invention.

FIG. 6 is a schematic view of an integration device according to a third embodiment of the present invention. FIG. 6 discloses another integration device 8. The difference between the above integration device 1 and the integration device 8 here is that the body 2 of the integration device 8 is a triangular object consisted of four faces having the exact same size and same shape. As shown in FIG. 6, if the control module 10 is fixed and assembled on one face of the body 2, the body 2 is only able to assembled three function modules 3, i.e., the integration device 8 may be simultaneously supporting three additional functions. If the control module 10 is arranged inside the body 2, the body 2 will be able to assembled four function modules, i.e., the integration device 8 may be simultaneously supporting four additional functions at most. In another embodiments, the body 2 can be in another types or shapes, not limited just in the square object and the triangular object set forth before.

In part of the embodiments, the function modules 3 may be the modules with a flat outer surface. When being assembled on one of the assembling slots 3, the outer surface of the function modules 3 are at an elevation same as the surfaces of the body 2.

In part of the embodiments, each function module 3 may be arranged with a denting surface or a protruding surface due to its function.

Figure 7:
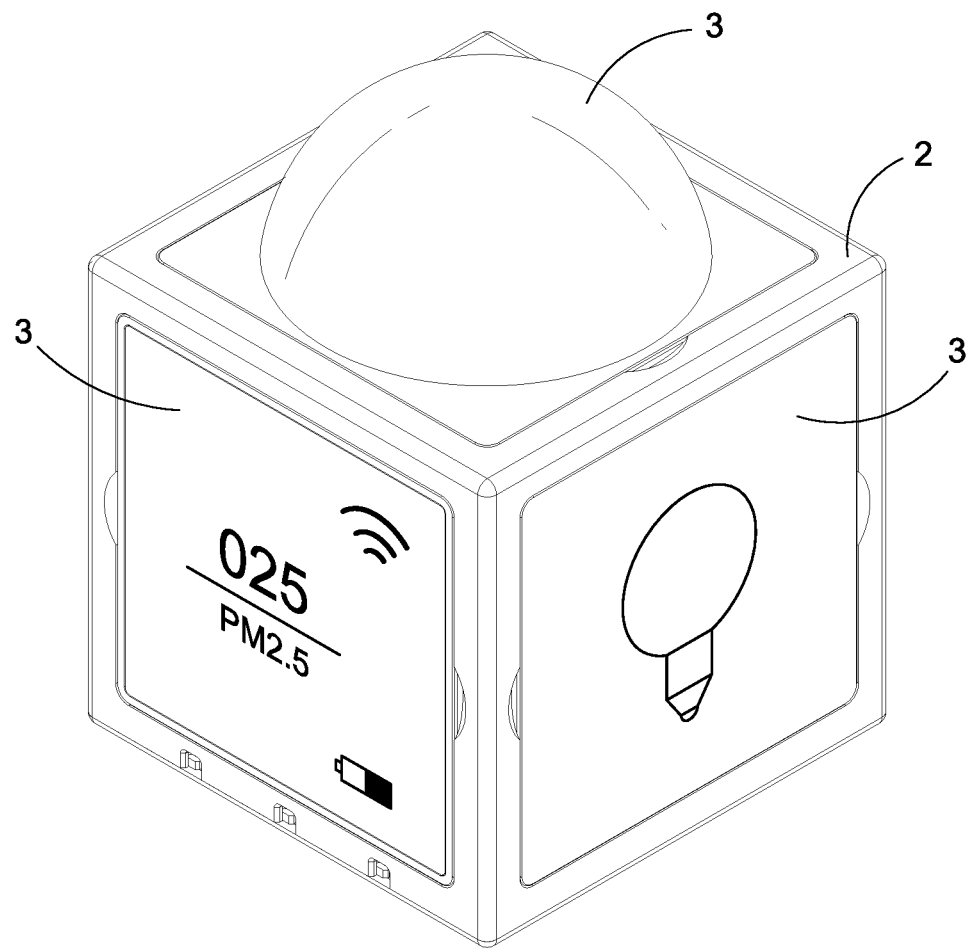
FIG. 7 is a schematic view of an integration device according to a fourth embodiment of the present invention.

Please refer to FIG. 7, which is a schematic view of an integration device according to a fourth embodiment of the present invention. In the embodiment of FIG. 7, the function module 3 assembled on the top face of the body 2 is an infrared module. The outer surface of the infrared module is protruding outward and distances from the surface of the body 2, therefore, the effective emitting range of the infrared module is greatly improved, the accuracy of the infrared module is ensured, so the infrared module is more usable when being assembled on the integration device 1.

Also, as shown in FIG. 1A, FIG. 1B, FIG. 3A, and FIG. 3B, at least one denting part 210 is formed at one edge of each assembling slot 21 of the body 2. According to the formed denting parts 210, the function modules 3 assembled thereon are easier to be removed therefrom by the user.

As shown in FIG. 1B and FIG. 3B, each of the assembling slots 21 is respectively arranged with a first magnetic component 23, each of the function modules 3 is respectively arranged with a second magnetic component 32 at a position that is corresponding to the first magnetic components 23. When one function module 3 is assembled onto the body 2, the function module 3 may attach directly to one assembling slot 21 through the corresponding first magnetic component 23 and second magnetic component 32. In particular, the first magnetic components 23 and the second magnetic components 32 can be respectively arranged on the inside or outside of the assembling slots 21 and the function modules 3, not limited to the positions in the drawings. Further, the first magnetic components 23 and the second magnetic components 32 in this embodiment may be metal plates and corresponding magnets.

In this embodiment, the aforementioned first connection ports 22 and second connection ports 31 may be contact connectors, insertion connectors, or pogo pins. When one of the function modules 3 is assembled onto one of the assembling slots 21 by the user, the function module 3 may connect with the control module 10 directly through the first connection port 22 and the second connection port 31 and be fixed in the assembling slot 21 through the first magnetic component 23 and the second magnetic component 32. Therefore, locking structures are unnecessary to be arranged on the body 2 and the function module 3, thus the manufacturing time of the body 2 is greatly reduced, and the assembly difficulty of the integration device 1 is lower.

It should be mentioned that if the first connection ports 22 and the second connection ports 31 are pogo pins, each of the assembling slots 21 may be arranged with more than one of the first magnetic components 23 (for example, three first magnetic components 23 or four first magnetic components 23), and each of the function modules 3 may also be arranged with corresponding amount of the second magnetic component 32, so as to ensure that the magnetic force of the magnetic components 23, 32 is enough for the pogo pins.

Figure 8:
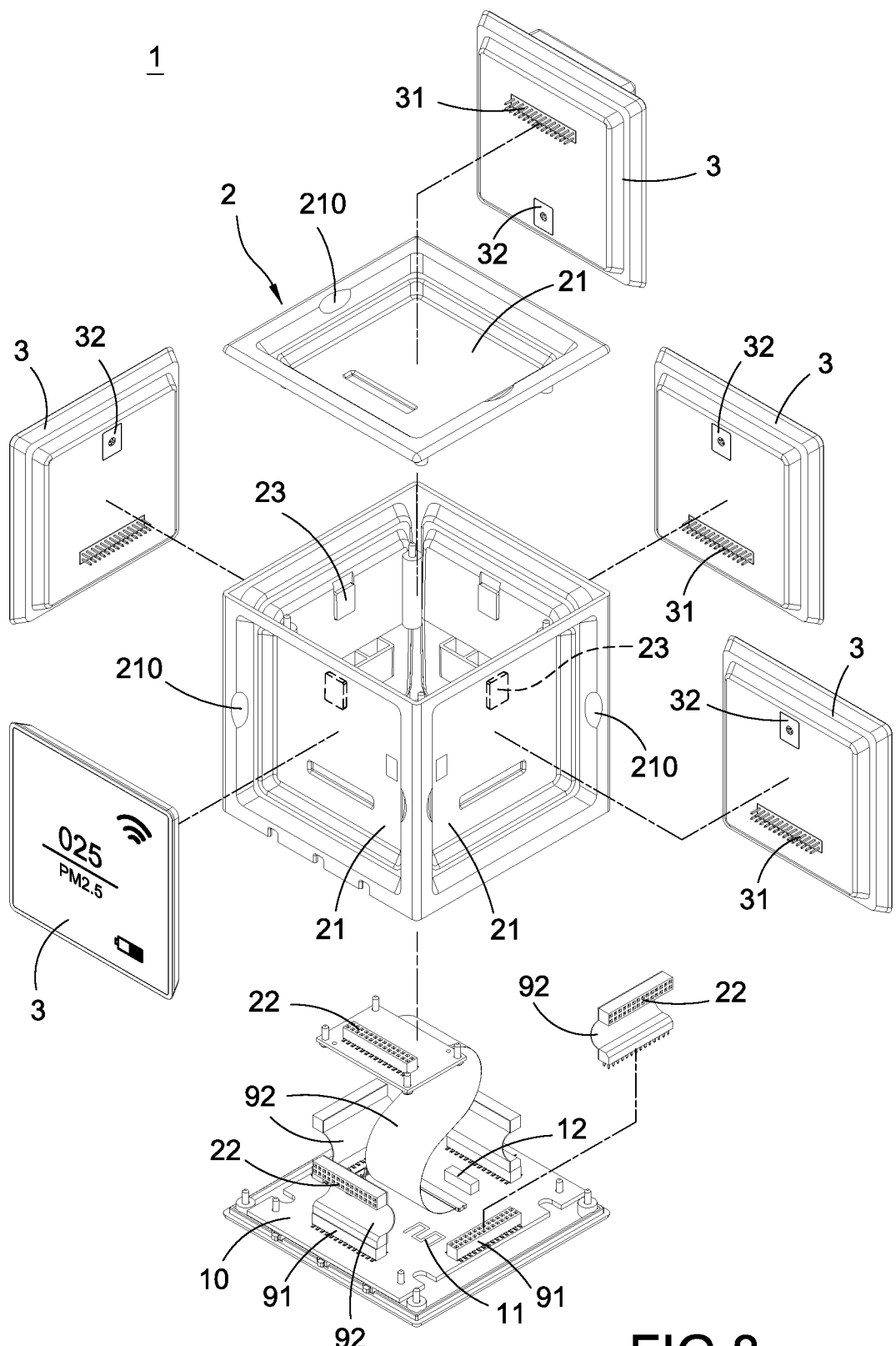
FIG. 8 is an exploded view of an integration device according to a fifth embodiment of the present invention.

FIG. 8 is an exploded view of an integration device according to a fifth embodiment of the present invention. In comparison with the embodiments shown in FIG. 1B and FIG. 9, the control module 10 in FIG. 8 further includes multiple cables 92. One end of each cable 92 is respectively connected to the transforming port 91 of the circuit board, another end of each cable 92 is respectively connect to the aforementioned first connection port 22. In other words, each of the first connection ports 22 in this embodiment is to connect to the transforming port 91 on the circuit board of the control module 10 through one of the cables 92. Therefore, the manufacturer is easier to adjust the arranged positions of the first connection ports 22 on the body 2 when manufacturing the integration device 1, and the assembly procedure of the integration device 1 becomes easier as well.

By using the integration devices 1, 1', 8 of the present invention, the users are allowed to select one or more function modules 3 according to their real demand. The users may assemble the one or more selected function modules 3 onto the body 2 respectively through an easy assembly procedure, use the control module 10 upon the body 2 to integrate all information of each of the function modules 3, provide power to each of the function modules 3 and enable each of the function modules 3 to connect to the Internet. As a result, the procedure for setting IoT is effectively simplified, the complexity of using IoT is reduced, and the willingness of the users in using IoT is increased.

As the skilled person will appreciate, various changes and modifications can be made to the described embodiment. It is intended to include all such variations, modifications and equivalents which fall within the scope of the present invention, as defined in the accompanying claims.

What is claimed is:

1. An integration device for integrating function modules, used to communicate with an IoT device in the environment, comprising:
    a plurality of function modules, each function module respectively being capable of different function;
    a body, consisted of at least three faces, each face being formed thereon an assembling slot respectively, wherein each assembling slot is a notch being formed by performing an inwardly indenting process from each face of the body, and a size and a shape of every assembling slot are equal to a size and a shape of a back of every function module, and each of the function modules is directly assembled on any one of the assembling slots of the at least three faces of the body, wherein a denting part is formed at an edge of each assembling slot for each of the function modules to be easily removed from each assembling slot; and
    a control module, arranged in the body and comprising a wireless transmission unit and an MCU electrically connected with the wireless transmission unit, the control module having a plurality of first connection ports, one end of each first connection port is electrically connected with the MCU and other end of each first connection port is extended and exposed in each assembling slot;
    wherein every function module assembled on each of the assembling slots of each face of the body is directly connected with the MCU through each first connection port and connected with the wireless transmission unit through the MCU, and is configured to communicate with the IoT device through the wireless transmission unit in the body, and a space of one of the assembling slots is filled by the back of one of the function modules when the function module is assembled on the assembling slot.

2. The integration device in claim 1, wherein the body is a square object consisted of six faces having same size and same shape, or a triangular object consisted of four faces having same size and same shape.

3. The integration device in claim 1, wherein the plurality of function modules comprises a fan module, a light switching module, an air-condition controlling module, an air quality sensing module, a contact sensing module, a temperature sensing module, a humidity sensing module, a vibration sensing module, a person sensing module, a smoke sensing module, a doorbell controlling module, an infrared module, a camera module, a wireless charging module, a display module or a speaker module.

4. The integration device in claim 1, wherein each function module respectively has a second connection port corresponding to one of the first connection ports, and each function module is electrically connected with the first connection port through the second connection port when being assembled on each assembling slot.

5. The integration device in claim 1, wherein the wireless transmission unit is a Bluetooth Lower Energy (BLE) unit or a Wi-Fi unit.

6. The integration device in claim 1, wherein the body is arranged with a power supplying port electrically connected with the MCU, the power supplying port is configured to receive external power for providing the power to each of the function modules.

7. The integration device in claim 6, wherein the control module comprises a battery unit electrically connected with the MCU, the battery unit is configured to receive the power from the power supplying port for charging, and to provide saved power to each of the function modules through the MCU while the power supplying port stops receiving the power.

8. The integration device in claim 7, wherein the battery unit is one of the plurality of function modules and is removably assembled on one of the assembling slots.

9. The integration device in claim 8, wherein the battery unit is a portable power bank.

10. The integration device in claim 1, wherein each assembling slot is respectively arranged with one or more first magnetic components, each function module is respectively arranged with one or more corresponding second magnetic components, and the function modules are respectively attached on each of the assembling slots through the first magnetic components and the second magnetic components.

11. The integration device in claim 1, wherein the control module is arranged with multiple vertical transforming ports, each transforming port is electrically connected to the MCU, one end of each first connection port is electrically connected with one of the transforming ports, and other end of each first connection port is respectively extended and exposed in each assembling slot.

12. The integration device in claim 11, wherein the control module comprises multiple cables, one end of each cable is electrically connected with one of the transforming ports on the control module, and other end of each cable is electrically connected with each first connection port.

* * * * *